United States Patent
Jullien et al.

(10) Patent No.: US 9,949,415 B2
(45) Date of Patent: Apr. 17, 2018

(54) MAGNETIC SHIELD FOR THE END OF A MULTIWIRE CABLE

(71) Applicant: Safran Electrical & Power, Blagnac Cedex (FR)

(72) Inventors: Charles Jullien, Grenade (FR); Jean-Luc Biesse, Saint Lieux les Lavaur (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 0 days.

(21) Appl. No.: 15/550,933

(22) PCT Filed: Feb. 16, 2016

(86) PCT No.: PCT/FR2016/050358
§ 371 (c)(1),
(2) Date: Aug. 14, 2017

(87) PCT Pub. No.: WO2016/132065
PCT Pub. Date: Aug. 25, 2016

(65) Prior Publication Data
US 2018/0035577 A1    Feb. 1, 2018

(30) Foreign Application Priority Data

Feb. 17, 2015  (FR) ...................... 15 51313

(51) Int. Cl.
*H05K 9/00* (2006.01)
*H01R 13/6598* (2011.01)
*H01B 11/14* (2006.01)

(52) U.S. Cl.
CPC ............ *H05K 9/0098* (2013.01); *H01B 11/14* (2013.01); *H01R 13/6598* (2013.01)

(58) Field of Classification Search
CPC .................................................. H05K 9/0098
See application file for complete search history.

(56) References Cited

U.S. PATENT DOCUMENTS

| | | | | |
|---|---|---|---|---|
| 4,301,428 A | * | 11/1981 | Mayer ................. | H01B 7/0054 174/36 |
| 4,426,636 A | * | 1/1984 | Ohta ...................... | H01B 1/24 29/613 |
| 8,658,899 B2 | * | 2/2014 | Gundel ................ | H01B 7/0861 174/110 R |
| 2015/0235741 A1 | * | 8/2015 | Sumi ................... | H01B 11/1083 174/36 |
| 2016/0366795 A1 | * | 12/2016 | Ohkubo ................ | H01B 7/0045 |
| 2017/0036620 A1 | * | 2/2017 | Nagahashi .......... | B60R 16/0215 |

FOREIGN PATENT DOCUMENTS

| | | |
|---|---|---|
| EP | 0 716 477 A2 | 6/1996 |
| EP | 1 117 285 A1 | 7/2001 |
| JP | H06-215639 A | 8/1994 |
| JP | H11-40981 A | 2/1999 |
| JP | 2002-25356 A | 1/2002 |
| JP | 2002-198239 A | 7/2002 |

* cited by examiner

*Primary Examiner* — Hung V Ngo
(74) *Attorney, Agent, or Firm* — Blank Rome LLP

(57) ABSTRACT

An assembly for the magnetic shielding of an electrical cable. The assembly has an electric cable adapted to the flowing of an electric current. The assembly further has a jacket positioned around the cable, and an electrical connector that the cable is connected to. The jacket is provided with magnetized particles to electromagnetically shield the end of the cable.

6 Claims, 2 Drawing Sheets

MAGNETIC SHIELD FOR THE END OF A MULTIWIRE CABLE

Figure 1:
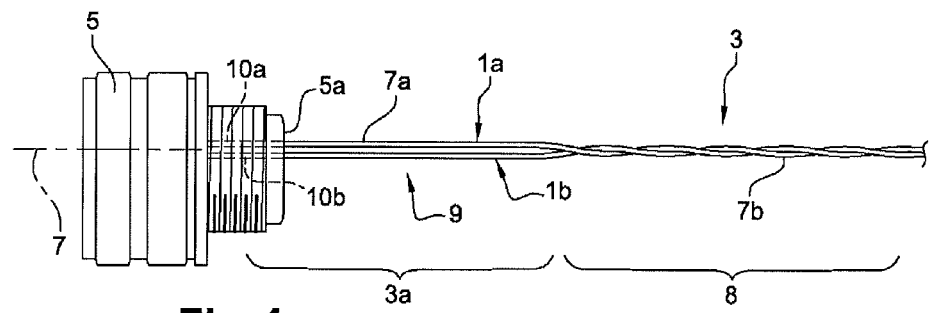

This application is a national stage of International Application No. PCT/FR2016/050358, filed on Feb. 16, 2016, which claims the benefit of French Patent Application 1551313, filed Feb. 17, 2015, the contents of each of which are incorporated herein by reference.

The present invention relates to a magnetic shield for electrical cables. The ends of such cables are more particularly concerned.

Typically, in electrical systems, many wired connections, whether they convey power or data, are provided by twisted multiwire cables, whether shielded or not.

An electromagnetic shield is a shield which is intended for reducing the electromagnetic field in the vicinity of an object by interposing a barrier between the field source and the object to be protected. The barrier must be made of electrically-conductive material. Electromagnetic fields are for instance used for protecting equipment from radiofrequencies andelectric interferences.

A shielded cable is typically an electrical cable with a shield in the form of wires wound around the cable core. The shield eliminates or reduces the radiation from the conductor and also prevents an interfering signal from being added to the signal/power carried by the conductor.

Thus, the cable is somehow locked in a Faraday cage. In the case of multiwire cables, one shield can be used on the multiwire cable or shields can be used on the unit cables. The shield must be connected to the ground.

The solution provided by the invention prevents the above, by proposing an assembly comprising:
- an electrical cable adapted to the flowing of an electric current,
- a jacket positioned around said cable (over at least a part of the length thereof) with said jacket being provided with magnetised particles.

For an easy sliding along the cable or the wires, the jacket may include a sheath slipped onto said cable.

For a quick positioning, or removal, the jacket might also be provided with a band wound up around said cable.

For a high-quality protection, it is also recommended that the jacket should be solid walled and continuously surround the circumference of the cable or the wire(s) that it is made of.

For an easy and practical manufacturing and achieving concrete results, this jacket will advantageously contain electrically non-conductive material, such as glue or varnish, charged with a magnetic material, such as ferrite particles.

The above-mentioned shield consisting of a jacket provided with magnetised particles will advantageously be used around one end of the cable. As a matter of fact, the cable is untwisted and advantage is taken that, at one end, the cable is typically connected, in a removable way, to a connector.

Besides, it is known that, In the case of multiwire cables, twisting the individual wires of such cables enables an efficient limitation of the electromagnetic coupling, both during emission and reception, of the latter and the electrically close environment thereof; significant interference on or from such electromagnetic environment by/from such cables can thus be avoided.

Such twisted multiwire cables are typically intended to be inserted into end connectors, which are provided for electrically connecting together two cables to be positioned end to end, or for connecting at least one such cable to an electric circuit.

To insert the individual wires of such cables into a connector while complying with the standards and the mechanical constraints associated with the multi-wire cables, the end connector and the insertion/extraction tools, the cables have to be untwisted at their ends.

Now, it turned out that this was sufficient to very significantly degrade the (transmission/reception) immunity performances resulting from the twisting of the wires relative to the potential, electromagnetically sensitive or interfering, close couplings, particularly in the same connector.

It is thus recommended:
- that, if said assembly comprises an electrical connector which said cable is connected to, at one end,
- and if said electrical cable comprises several electrical wires twisted together, except at said end,
- the jacket should be positioned around the untwisted wire(s), at said end.

Thus, limited disturbances will be noted, at least for a magnetic field frequency of less than 3 MHz.

For this purpose, it is moreover also recommended that, in the jacket (the sheath or the band), the magnetised particles should be oriented perpendicularly to the direction of flow of the electric current in the cable, although this is a priori less efficient in the wound band version, because the magnetic bands can then show modifications in the orientation of the electromagnetic fields, so that the optimum orientation is not ensured and therefore the optimum effect may not be fully effective.

In one embodiment, the jacket will be, at said twisted end, positioned around said wires, which under the jacket, will thus be untwisted and additionally electromagnetically unshielded.

As a matter of fact, the results addressed later in the description show the uselessness of such a traditional electromagnetic shielding such as a mesh or a wire wrapping around the cable core or of one electrically conductive wire thereof, or still a rigid shielding of the Faraday cage type or a steel screen having a mesh size smaller than the wavelength to be stopped.

In other words, the jacket of the invention can be placed directly around the electrically insulating sheath that lines the electrically conductive core of the wire(s) or the cable.

And if this jacket is slidably positioned along the twisted portion of such wires, free access will remain to the wires of the multi-wire cable, thus easily enabling useful operations (repair, maintenance, . . . ) without complicating the design and/or production of the connectors, nor requiring a connection to the ground.

Figure 2:
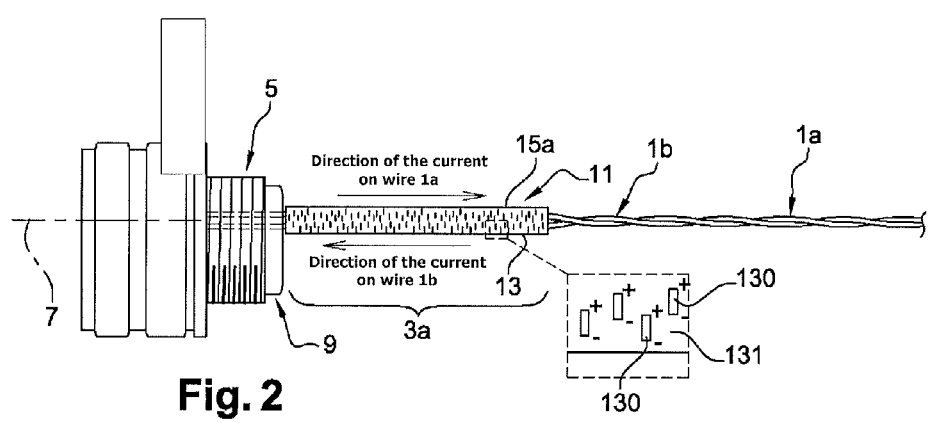
Figure 3:
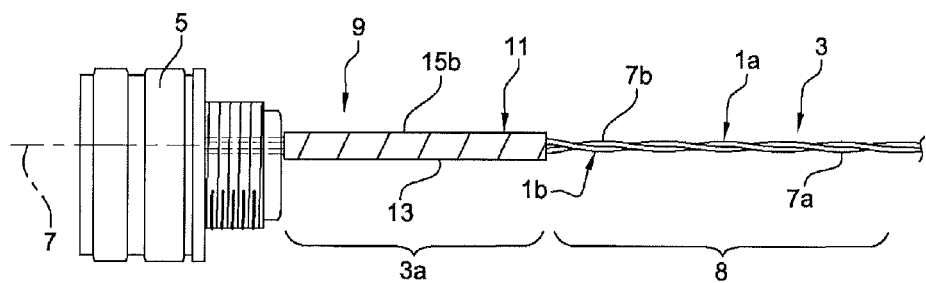
Figure 4:
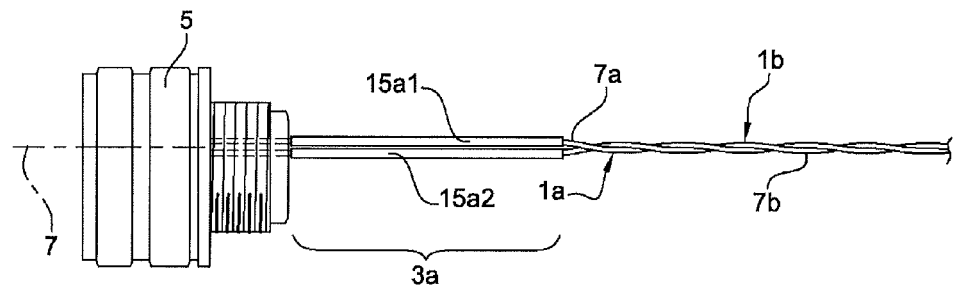
Figure 5:
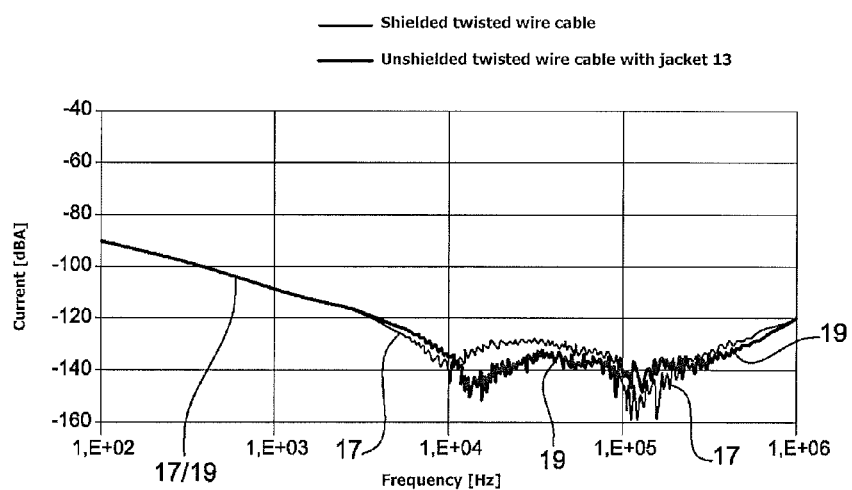

Other details, characteristics and advantages of the invention will appear when reading the following description hereunder, which is a non restrictive example, referring to the appended drawings, wherein:

FIG. 1 shows a pair of wires, partially twisted together and connected to a connector, FIGS. 2, 3 schematically show a protective jacket solution according to the invention; in FIG. 2, the jacket is a sheath, in FIG. 3, it is a wound band, FIG. 4 shows a solution with one sheath for each electrical wire, and FIG. 5 illustrates tests results.

FIG. 1 thus shows a diagram of a pair of wires 1*a*, 1*b* of an electrically conductive cable 3.

At one end, each wire 1*a*, 1*b* is bare, thus exposing its electrically conductive core, respectively 10*a*, 10*b*, for connection to the aircraft connector 5.

On the rest of its length, each wire 1 *a*, 1*b* is lined with an electrically insulating sheath, respectively 7*a*, 7*b*.

It would be the same if the cable consisted of a single electrically conductive wire (like 1a), or more than two wires.

As regards the connection, the connector 5 has a face 5a provided with as many openings as there are wires 1a, 1b . . . to be connected, with each one receiving the tight fitting of one of such wires. Here, at its opposite axial end, the connector 5 further has a face which is either provided with as many holes (in the case of a female connector) as there are pins (or connecting pins) of another (male) connector to be engaged therein for coupling such connectors, or with pins in an identical number.

In this example, the wire cable 3 is twisted and unshielded.

As a matter of fact, from the end attached to the connector 5, the wires 1a, 1b are first non twisted on a portion 3a (the wires are substantially mutually parallel and parallel to the general direction 7 along which the cable extends), and then, when for example 4-8 cm are wound together (Zone 8 in FIG. 1) along such general direction 7, a priori over their entire length, or at least up to the vicinity of the opposite end where the same assembly will preferably be provided.

Besides, the twisted pair is here electromagnetically unshielded; thus, for example it is not covered with a wire mesh surrounding the core of each (or all the) wire(s).

The assembly 9 formed by the cable attached to the connector 5 is however in a preparatory state in FIG. 1.

On the contrary, it complies with the invention in FIG. 2 or 3, wherein the device 11 for magnetically shielding the end 3a of the cable 3 comprises a jacket 13 positioned, in each case, directly around, in contact with, the (or each) electrically insulating sheath(s) lining the electrically conductive core of the cable.

In FIG. 2 the jacket is a sheath 15a, in FIG. 3, it is a band, 15b.

The band 15b is wound about the cable. The sheath 15a has been slipped onto the cable.

The jacket 13 totally surrounds the cable 3. It may be solid- or continuous-walled, without any hole, nor any meshed aspect. It is preferably flexible, to fit the bending of the wires.

As already mentioned above, on a non-shielded cable, twisting together the individual wires significantly limits the (transmission and reception) electromagnetic coupling between the latter and the electromagnetically sensitive or interfering surrounding environment.

On the not twisted or untwisted end portion 3a, the jacket 13 will play this part, i.e. be the means for limiting the electromagnetic coupling, at low frequency, i.e. less than 3 MHz.

For this purpose, the jacket will be provided with magnetised particles (thus with a magnetizable material) 130.

In practice, the jacket 13 may comprise a plastic material, such as resin or glue, or a varnish 131 impregnated with such magnetised particles 130. Such plastic material shall not be electrically conductive.

As shown in FIG. 2, with the local enlargement, the magnetic particles which are in the jacket 13 totally surrounding the cable 3 are oriented perpendicularly to the flow of the electric current inside such cable (see the indicated direction of the current, in FIG. 2). The + and − signs show the direction of the magnetic orientation of the particles. Such particles can for instance be ferrite powder. For more efficiency, the length of the shield 13 shall preferably be sufficient to totally cover at least the whole area 3a.

If, as illustrated, the electrical cable 3 comprises several electrical wires twisted together, except at said end 3a, the jacket will advantageously consist of a sliding sheath 15a positioned around such untwisted portion of the wires only, which will thus make it possible to slide it along the twisted portion, for instance if maintenance is required on the connector 5.

The above embodiments will apply specifically if, at least at said end 3a, the jacket is positioned about wire(s), such as 1a, 1b, which, under the jacket, is/are not twisted and not electromagnetically shielded. As a matter of fact, if a minimum shielding of a multiwire cable limits the electromagnetic interferences induced or supported by the cable, twisting such cable results in the same effect, in the end. Thus, combining both solutions will mainly make it possible to enhance the mechanical properties of the cable. However, it will typically be necessary to remove the shielding, or even untwist the wires on a distance sufficient to insert the wires into the connector, at the end.

In FIG. 4, one sheath 15a for all the electrical wires has not been provided for, but one sheath 15a1, 15a2 for each electrical wire 1a, 1 b, has been positioned about the not twisted end area thereof. This solution is less practical, as regards maintenance.

FIG. 5 shows test results which show the reduction in the electromagnetic interferences when frequency increases. The curve 17 is that of a two-wire cable of the prior art, twisted with an electromagnetic shielding in the form of a wire wrapping surrounding the cable, except at the end where the wires are untwisted. The curve 19 is that of a two-wire cable according to the invention with a jacket 15a provided with magnetised particles 130 and directly surrounding the insulating sheaths of both electrically conductive cores of the two-wire cable. In each case, a 1 m cable has been electrically supplied in differential mode, from a 1V generator, coupled with an adjacent wire. It can be seen that the results established by the curves 17 and 19 are very similar and thus show an efficient reduction in the interferences, at low frequency, when the solution of the invention is used.

The invention claimed is:

1. An assembly for the magnetic shielding of an electrical cable, the assembly comprising:
   an electric cable adapted to the flowing of an electric current;
   a jacket positioned around said cable; and
   an electrical connector which said cable is connected to, at one end,
   wherein said electrical cable comprises several electrical wires twisted together, except at said end,
   wherein the jacket is positioned around the untwisted wire(s) at said end,
   wherein the jacket positioned around the wires can slide along the twisted portion, and
   wherein the jacket is provided with magnetized particles oriented perpendicularly to the direction of the electric current flow in the cable.

2. The assembly of claim 1, wherein the jacket comprises a band wound around said cable.

3. The assembly of claim 1, wherein the jacket comprises a sheath slipped onto said cable.

4. The assembly of claim 1, wherein at said end, the jacket is positioned around said wires which, under the jacket, are not twisted and not electromagnetically shielded.

5. The assembly of claim 1, wherein the jacket is solid-walled.

6. The assembly of claim 1, wherein the jacket comprises an electrically non-conductive material charged with a magnetic material such as ferrite particles.

* * * * *